United States Patent [19]

Phillips et al.

[11] Patent Number: 4,952,995
[45] Date of Patent: Aug. 28, 1990

[54] INFRARED IMAGER

[75] Inventors: James D. Phillips; Thomas N. Casselman; Thomas L. Koch, all of Goleta, Calif.

[73] Assignee: Santa Barbara Research Center, Goleta, Calif.

[21] Appl. No.: 265,330

[22] Filed: Oct. 27, 1988

Related U.S. Application Data

[63] Continuation of Ser. No. 860,967, May 8, 1986, abandoned.

[51] Int. Cl.$^5$ .................. H01L 29/78; H01L 29/161; H01L 27/14
[52] U.S. Cl. ...................... 357/24; 357/16; 357/30; 357/88
[58] Field of Search ................ 357/24 LR, 24, 24 M, 357/16, 30 B, 30 E, 88

[56] References Cited

U.S. PATENT DOCUMENTS

| | | |
|---|---|---|
| 3,806,772 | 4/1974 | Early . |
| 3,896,485 | 7/1975 | Early . |
| 3,999,082 | 12/1976 | Early . |
| 4,228,365 | 10/1980 | Gutierrez et al. ............. 357/24 LR |
| 4,257,057 | 3/1981 | Chenng et al. .......................... 357/16 |
| 4,258,376 | 3/1981 | Shannon ........................... 357/24 M |
| 4,273,596 | 6/1981 | Gutierrez et al. . |
| 4,357,620 | 11/1982 | Wang et al. ........................... 357/16 |

FOREIGN PATENT DOCUMENTS 0142891 5/1985 European Pat. Off. .......... 357/30 E Primary Examiner—Andrew J. James
Assistant Examiner—Ngan Van Ngo
Attorney, Agent, or Firm—W. C. Schubert; W. K. Denson-Low

[57] ABSTRACT

An infrared imager (10) is disclosed for sensing infrared radiation. The imager (10) comprises a detection layer (14) of semiconductor material which is operable to detect the occurrence of infrared radiation and generate free charge carriers in response thereto. The imager (10) also includes a transfer layer (16) which is operable to generate a signal in response to the free charge carriers infrared radiation generated by the detection layer (14) and deliver the signal to the output of the imager (10). An electropotential barrier (18) is located within the imager (10) to selectively restrict migration of free charge carriers from the detection layer (14) to the transfer layer (16). The imager (10) includes a buried channel (49) and is capable of two color operation.

12 Claims, 2 Drawing Sheets

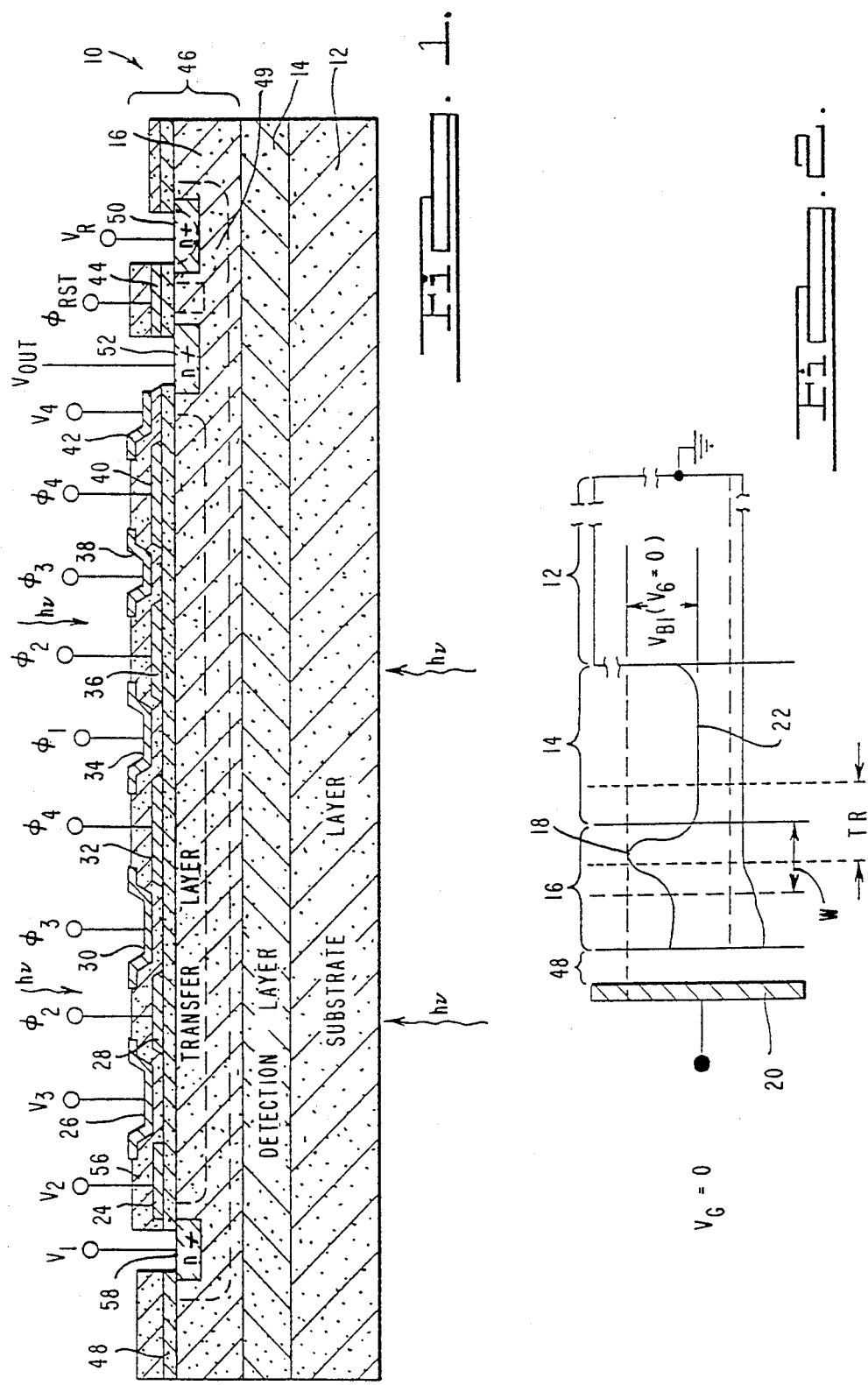

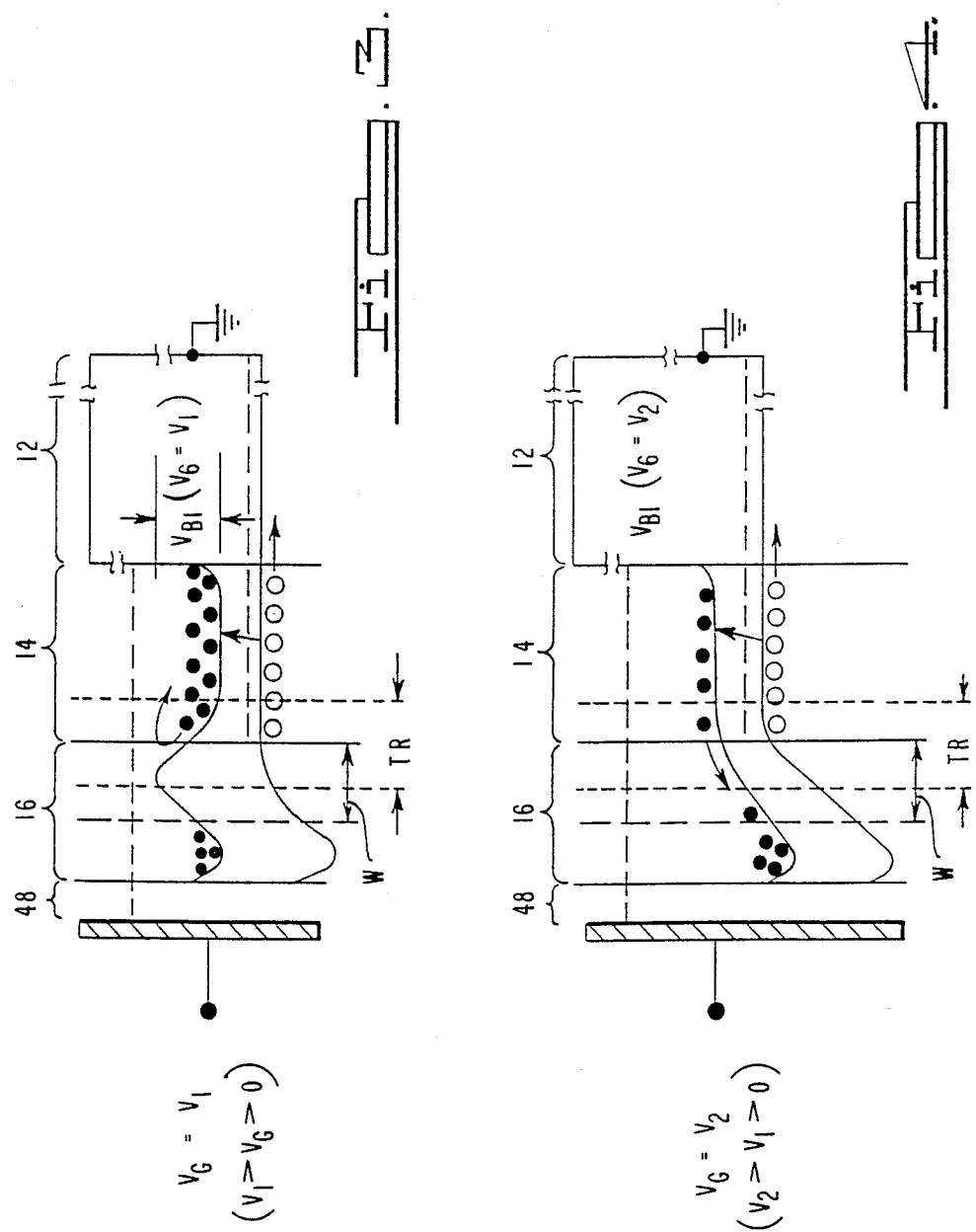

INFRARED IMAGER

This application is a continuation of application Ser. No. 860,967, filed May 8, 1986 now abandoned.

BACKGROUND OF THE INVENTION

1. Field of the Invention

This invention relates to the field of infrared imaging devices, and more particularly to a buried channel charge-coupled dual wavelength infrared focal plane imager.

2. Description of Related Art

Infrared detectors are often used in conjunction with missile and night vision systems to sense the presence of electromagnetic radiation having wavelengths of 1-15 μm. Such detectors are often embodied in focal plane imagers in which two-dimensional representations of an image can be obtained by using appropriate scanning techniques. Focal plane imagers may generally be characterized as either being monolithic or hybrid in structure. In monolithic focal plane imagers, the operations of photodetection, charge generation, and charge transfer are performed by a structure designed from a single material. To perform these operations within a single structure, nonolithic focal plane imagers generally comprise a charge-coupled device ("CCD") or an array of MOSFET'S for random access addressing used in conjunction with an infrared sensitive substrate consisting of either a narrow bandgap semiconductor or an extrinsic semiconductor having the appropriate impurity energy level. A narrow bandgap material for infrared detection in the 1-15 μm range is simply a material in which the energy required to excite a valence band electron to the conduction band is relatively low (between nominally 1.0 eV and 0.1 eV for the indicated wavelength ranges).

Charge-coupled devices used with the focal plane imagers described above may generally be characterized as having an elongated MOS tansistor with an extended array of gates between its source and drain. During operation of a p-channel charge-coupled device, a charge packet consisting of a concentration of holes are held in place for a short period of time by application of a negative voltage to one of the gates. If that voltage is then reduced while an adjacent gate is energized, the charge packet migrates to a new position under the adjacent gate. By applying pulses to alternate gates, a sequence of charge packets can be transferred from one or more gates to the drain of the imager. Similar devices can be made from n-channel materials.

One monolithic focal plane imager which incorporates a charge-coupled device is described in U.S. Pat. No. 4,273,596. The imager disclosed in this patent comprises a substrate layer of cadmium telluride upon which four epitaxial layers are grown. The last of the epitaxial layers interfaces with a series of Schotty barrier contact gates which are connected to a charge-coupled device. The fabrication of this type of device is relatively complex, having the inherent drawback of requiring a window layer, a substrate layer, a wide bandgap spillover layer, a narrow bandgap absorber layer, a transfer layer, and a channel layer in addition to the layers which form the gates of the charge-coupled device. Fabrication of the epitaxial layers of this device may require that several of the layers be individually doped and may involve the use of metalorganic chemical vapor deposition procedures.

While the imagers generally described above would be somewhat effective in processing infrared signals, other drawbacks in addition to those already mentioned exist. By not having a buried channel, the constraints placed on the passivant layers of the CCD are generally severe with a simultaneous demand for simple passivation and high quality gate insulator characteristics. Thus, low interface state densities and fixed charge in the insulator must be achievable while also making the detector insensitive to contamination which might otherwise cause premature failure or drift in its electrical characteristics. In addition, the high voltage required to lower the electropotential barrier at the heterojunction between the wide and narrow bandgap materials could produce relatively large tunnel currents. Finally, these devices will not generally detect infrared radiation in more than one specific range in the infrared spectrum.

SUMMARY OF THE INVENTION

According to the preferred embodiment of the present invention, an infrared imager is disclosed for sensing infrared radiation. The imager comprises a detection layer of semiconductor material which is operable to detect the occurrence of infrared radiation and generate free charge carriers in response thereto. The imager also includes a transfer layer which is operable to generate a signal in response to the infrared radiation generated by the detection layer and deliver the signal to the output of the imager. An electropotential barrier is located within the imager to selectively restrict migration of free charge carriers from the detection layer to the transfer layer. The imager includes a buried channel and is capable of two color operation.

BRIEF DESCRIPTION OF THE DRAWINGS

The various advantages of the present invention will become apparent to one skilled in the art upon reading the following specification and by reference to the following drawings in which:

FIG. 1 is a cross-sectional view of the preferred embodiment imager according to the present invention;

FIG. 2 illustrates an energy band diagram of one gate of the imager shown in FIG. 1 when the bias of the gate is zero;

FIG. 3 illustrates an energy band diagram of the gate of the imager shown in FIG. 2 when the gate bias exceeds zero by a certain voltage; and FIG. 4 illustrates an energy band diagram of the gate of the imager of FIG. 2 when the gate bias is greater than the gate bias shown in FIG. 3.

DESCRIPTION OF THE PREFERRED EMBODIMENT

To provide a base material upon which a focal plane imager 10 of the present invention can be grown, a substrate layer 12 is formed from a semiconductor material such as CdZnTe. CdZnTe has an inherent advantage of having a relatively low dislocation density (approximately $10^4$ cm$^{-2}$) and a lattice match sufficiently close to $Hg_{(1-x)}Cd_xTe$ (in the x range of interest) to allow the growth of a high quality epitaxial layer of $Hg_{(1-x)}Cd_xTe$. It is to be understood, however, that other suitable materials such as CdTe and CdSe may also be used. While the substrate layer may have a thickness of 500 μm and have a p-doped carrier concentration of approximately $10^{16}$ cm$^{-3}$, other suitable thicknesses and carrier concentrations may be used.

To generate free charge carriers upon receipt of infrared radiation in a preselected range of the infrared spectrum, a detection layer 14 is grown on the substrate layer 12. The detection layer 14 comprises a p-doped layer of mercury-cadmium-telluride having a stoichiometric relationship defined by $Hg_{(1-x)}Cd_xTe$. It is to be understood, however, that other suitable materials may also be used. The composition value of x is chosen to be approximately 0.2 so that the detection layer 14 will be sensitive to long wavelength infrared radiation having a cut-off wavelength of approximately 10–12 $\mu$m at the desired operating temperature (e.g., 77° kelvin). Different values of x may be chosen, however, to enable the detection layer 14 to be sensitive to infrared radiation in other ranges in the infrared spectrum. If the composition value of x is chosen to be approximately 0.2, then the detection layer 14 has an energy bandgap of approximately 0.1 eV. Since the energy bandgap of the substrate layer 12 is larger in comparison (e.g., approximately 1.6 eV), a first heterojunction is created there between. The heterojunction together with the doping of the substrate layer 12 described above permit the removal of holes which are generated in the manner described below.

When a photon of light in the infrared spectrum having an energy greater than the energy bandgap of the detection layer 14 is absorbed by the detection layer 14, the detection layer 14 generates a conduction band electron which is able to migrate to the other layers of the focal plane image 10 described subsequently. The holes created by the generation of the conduction band electrons either recombine ultimately with these electrons in the detection layer 14 or migrate to the base of the substrate layer 12 which is grounded as shown in FIG. 2. The detection layer 14 may be chosen to be approximately 5 $\mu$m in thickness and formed by using liquid phase epitaxial growth techniques in which the growth rate is approximately ½ micron per minute and occurs at a temperature between 300° C. and 500° C. It is to be understood however that molecular beam epitaxy, metalorganic chemical vapor deposition, or other suitable techniques may also be used.

To permit selective restriction of the migration of free electrons generated in the detection layer 14, a transfer layer 16 is grown on the detection layer 14. The transfer layer 16 comprises an n-doped layer of mercury-cadmium-telluride having a stoichiometric relationship defined by $Hg_{(1-y)}Cd_yTe$. Because of the difference in the composition values for the detection layer 14 and the transfer layer 16, a second heterojunction is created in the transition region TR at the transfer layer-detection layer interface. The composition value of y of the transfer layer 16 is chosen to be 0.5 so that the height of the electropotential barrier described subsequently can be maximized. With a composition value of 0.5, the energy bandgap of the transfer layer 16 is approximately 0.8 eV and is therefore able to sustain relatively large electric fields before tunnel currents are generated. In addition, the composition value of 0.5 also allows the transfer layer 16 to be sensitive to infrared radiation in a region of the infrared spectrum different from that sensed by the detection layer 14 at the requisite operating temperature (e.g., 77° Kelvin). It is to be understood, however, that other suitable materials and corresponding values for y may also be used. The transfer layer 16 has a thickness of approximately 2 $\mu$m and is formed by using liquid phase epitaxial growth techniques in which the growth rate is approximately ½ micron per minute and occurs at a temperature between 300° C. and 500° C. It is to be understood that other suitable epitaxial growth techniques and ranges of thicknesses may be used.

By suitably doping the detection layer 14 and the transfer layer 16 as described below, electrons from the n-type transfer layer 16 diffuse toward the junction between the transfer layer 16 and the detection layer 14. Similarly, holes from the detection layer 14 diffuse toward the transfer layer 16. This electron and hole migration produces an electropotential barrier 18 which is augmented by the energy bandgap differences between these layers. The electropotential barrier 18 inhibits photoexcited electrons in the detection layer 14 from migrating from the detection layer 14 to the transfer layer 16. As advanced epitaxial growth techniques such as metalorganic chemical vapor deposition and molecular beam epitaxy mature, the electropotential barrier 18 may also be formed by creating an abrupt transition region between the detection layer 14 and the transfer layer 16.

As shown in FIG. 2, the magnitude of the electropotential barrier 18 varies across the heterojunction between the detection layer 14 and the transfer layer 16. The variation in the potential energy can be approximately described by the following equation:

$$\Phi(z) = \Phi_o - q\theta(z) - \chi(z)$$

where $\Phi_o$ is a reference magnitude of the potential energy, $\theta(z)$ is the potential created by the dopants at the heterojunction and $\chi(z)$ is the electron affinity at the heterojunction. By controlling the diffusion coefficients of the dopants and the constituent atoms of the materials forming the heterojunction between the detection layer 14 and the transfer layer 16, the depletion region W can be located substantially within the transfer layer 16. This relative positioning of the depletion region may be achieved, for example, by selecting the doping density of the detection layer 14 to be nominally $5 \times 10^{15}$ cm$^{-3}$ and the doping density of the transfer layer 16 to be $10^{15}$ cm$^{-3}$. Because the depletion region W is located substantially within the transfer layer 16, most of the electric fields that are generated within the imager 10 are located in the transfer layer 16. Since the transfer layer 16 has larger energy bandgap than that of the detection layer 14, it is able to sustain the relatively large electric fields associated with the buried channel described below without tunnel currents being generated.

When an external electric field is absent in the transfer layer 16 (i.e., when the voltage $V_G$ applied to the gate 20 in FIG. 2 is zero), substantially all of the photoexcited electrons in the detection layer 14 are unable to migrate through the electropotential barrier 18 unless they have an energy greater than $V_{BI}(V_G=0)$. Because the energy level of the conduction band of the substrate layer 12 is chosen to be relatively high with respect to that of the detection layer 14, migration of photoexcited electrons in the detection layer 14 is also limited by the height of the conduction band of the substrate layer 12. The electropotential barrier 18 and the conduction band height of the substrate layer 12 therefore create an electropotential well 22 within the detection layer 14 which can accommodate the photoexcited electrons.

When the electrical potential applied to the gate 20 increases, the electric field thereby created causes a reduction in the magnitude of the electropotential barrier 18. When a potential of $V_1$ is applied to the gate 20 as shown in FIG. 3, the height of the electropotential barrier 18 is reduced to $V_{BR}(V_G=V_1)$ which is still of sufficient magnitude to prevent substantially all of the photoexcited electrons in the electropotential well 22 to migrate to the transfer layer 16. The electrons already in the transfer layer 16 are therefore able to be displaced through the transfer layer 16 without causing the electrons in the electropotential well 22 to migrate to the transfer layer 16. When the potential at gate 20 is increased to $V_2$ as shown in FIG. 4, the electropotential barrier 18 is eliminated which allows substantially all the photoexcited electrons in the electropotential well 22 to migrate to the transfer layer 16. Accordingly, when a potential of $V_G=V_2$ is applied to the gate 20 for a predetermined time, the number of free charge carriers in the transfer layer 16 under the gate 20 can be used to indicate the intensity of the infrared radiation received by the detection layer 14 in the region under the gate 20. These free charge carriers can then be displaced to the output of the transfer layer 16 without causing migration of the other free charge carriers in the electropotential well 22 to migrate into the transfer layer 16.

Because the transfer layer 16 and the detection layer 14 are sensitive to infrared radiation of different wavelengths, the imager 10 may be used for two color detection. By appropriate selection of the composition of the transfer layer 16 such as when the composition value of y approximately equals 0.5, the transfer layer 16 will generate free charge carriers upon receipt of shorter wavelength infrared radiation. Similarly, the appropriate selection of the composition of the detection layer 14 (e.g., x approximately equals 0.2) allows the detection layer 14 to become sensitive to longer wavelength infrared radiation. The free charge carriers excited by the shorter wavelength radiation in the transfer layer 16 may be separated from those generated by longer wavelength infrared radiation in the detection layer 14 by the electropotential barrier 18. This separation allows the photoexcited electrons generated in either the detection layer 14 or the transfer layer 16 to be separately displaced through the transfer layer 16 to the output of imager 10 and the magnitude of the infrared radiation in each respective portion of the infrared spectrum determined. Because the detection layer 14 may also be sensitive to shorter wavelength radiation, the shorter wavelength infrared radiation should be received through the charge-coupled device discussed below to prevent the shorter wavelength infrared radiation from generating free charge carriers in the detection layer 14. However, since the transfer layer 16 is transparent to longer wavelength infrared radiation, the longer wavelength radiation may be received either through the substrate layer 12 or the charge-coupled device. To maximize the fill-factor (i.e., the ratio of the active area of the imager 10 to its total area) of the imager 10, it is generally preferred that the longer wavelength infrared radiation be received through the substrate layer 12.

To transfer photoexcited electrons in the transfer layer 16 to the output of the imager 10 within a buried channel described below, the electrodes 24–44 of a charge-coupled device 46 are formed adjacent to the surface of the transfer layer 16 and are insulated therefrom by an insulator layer 48. The charge-coupled device 46 photoexcited electrons in the transfer layer 16 to be delivered to the output of the imager 10. The charge-coupled device 46 may be fabricated using PHO-TOX TM SiO$_2$ insulator technology, though it is to be understood that other suitable techniques may be used to form the charge-coupled device 46 and the insulator layer 48.

To create a buried channel 49 within the transfer layer 16, the transfer layer 16 includes n+-doped region 50. Prior to receipt of photoexcited electrons by the transfer layer 16, packets of electrons in the transfer layer 16 are sequentially removed from the layer 16 by clock signals applied to the electrodes 24–42 of the charge-coupled device 46. After each packet of electrons reaches n+-doped region 52, a reset signal is delivered to the electrode 44 through the buss $\Phi_{RST}$. Because n+-doped region 50 is supplied with a positive voltage (e.g. 5 volts) through buss $V_R$, the activation of the electrode 44 by the reset signal causes electrons located in the n+-doped region 52 to migrate from the region 52 to the n+-doped region 50. These electrons are then removed from the transfer layer 16 through the buss $V_R$. After this process has been repeated a predetermined number of times (e.g. 500 cycles), the transfer layer 16 becomes depleted of electrons which causes the potential maxima of the transfer layer 16 to move away from the interface between the transfer layer 16 and the insulator layers 48 and 56 thereby creating a buried channel 49. Accordingly, photoexcited electrons which are brought into the transfer layer 16 after the electropotential barrier 18 is reduced or which are generated in the transfer layer 16 by photoexcitation will tend to remain in the buried channel 49 as that is the region of the transfer layer 16 which is at the potential maxima. Because substantially all movement of electrons in the transfer layer 16 occurs through the buried channel 49, design constraints with respect to the necessary passivants of the insulator layer 48 and 56 are reduced as interface state traps will no longer be the trapping sites for charge transfer.

The transfer operation of the charge-coupled device 46 occurs by delivering sequential clock signals to the plurality of electrodes 28–40 through busses $\Phi_1$–$\Phi_4$. When a clock signal is first delivered to the electrode 34 through bus $\Phi_1$, an energy minima (potential maxima) region is formed within the region of the buried channel 49 underneath the electrode 34. This energy minima region then accumulates charge carriers which have migrated from the detection layer 14 to the buried channel 49 when the electropotential barrier 18 was eliminated. When the accumulated charges are to be transferred, a clock signal is delivered to the adjacent electrode 36 by the bus $\Phi_2$ causing an energy minima region to be formed underneath the electrode 36. Because the potential applied to the electrodes 34 and 36 is the same, accumulated charges in the energy minima region underneath the electrode 34 are able to migrate to the energy minima underneath the electrode 36. As the potential applied to the electrode 34 is reduced, the remaining accumulated charges in the energy minima region underneath the electrode 34 are transferred to the depletion region underneath the electrode 36. These accumulated charges may then be moved further down the transfer layer 16 by applying a clock signal to the electrode 38 through the bus $\Phi_3$, and then reducing the potential applied to the electrode 36. By sequentially clocking the electrodes 28–40 in this manner, the accumulated charges underneath one or more electrodes 28–40 can be transferred to the n+-doped region 50 which is connected to the output terminal Vout of the imager 10.

To control charge in the charge-coupled device 46, the charge coupled device 46 includes charge control busses $V_1$, $V_2$, $V_3$ and $V_4$. Charge control buss $V_1$ is used to inject charge into the buried channel 49 through n+-doped region 58 which forms a diode. By injecting charge into the buried channels 49 in this manner, bulk traps at the trapping sites become filled thereby eliminating their interaction with the signal charge. The charge control buss $V_2$ is used for controlling the amount of charge injected by charge control buss $V_1$ by regulating the potential of electrode 24. The charge control buss $V_3$ is used to temporarily store the charge injected by charge control buss $V_1$ under the electrode 26 until a clock signal is applied to electrode 28 through buss $\Phi_2$. Finally, the charge control buss $V_4$ applies a potential to the electrode 42 which is used to create a charge barrier between the charge stored under the electrode 40 and the n+-doped region 52 which forms a diode. Activation of the electrode 42 insures that the charge is not prematurely delivered to the n+-doped region 50 from the area underneath the electrode 40.

In practicing the method of the present invention, the transfer layer 16 is depleted of electrons as described above to create the buried channel 49 within the transfer layer 16. Longer wavelength infrared radiation is then received by the detection layer 14 through the substrate layer 12 and is converted into electrons by photoexcitation. After the electrons have been integrated for a period of time, a potential is delivered to the electrodes 28-40 of the charge-coupled device 46 causing the electropotential barrier 18 to be eliminated. The photoexcited electrons are then able to migrate from the detection layer 14 to the buried channel 49. The potential delivered to the electrodes 28-40 is then reduced to cause the electropotential barrier 18 to increase. The electrons which have accumulated in the buried channel 49 when the electropotential barrier 18 was reduced are then transferred out of the buried channel 49 by providing the necessary signals to the electrodes 24-42 of the charge-coupled device 46. During this transfer operation, the potential applied to the electrodes 24-42 is not sufficient to eliminate the electropotential barrier 18 thereby preventing substantially all electrons subsequently generated in the detection layer 14 from entering the buried channel 49.

The above method can also include the additional step of receiving infrared radiation in a second wavelength and transferring charge carriers generated thereby to the output of the imager 10. When such two wavelength detection is desired, shorter wavelength infrared radiation is received by the transfer layer 16 causing the transfer layer 16 to generate photoexcited electrons. While the electropotential barrier 18 is in place, photoexcited electrons generated in the transfer layer 16 are transferred out of the output of the imager 10 by the charge-coupled device 46. After the photoexcited electrons generated in the transfer layer 16 are transferred out of the imager 10, photoexcited electrons generated in the detection layer 14 by longer wavelength infrared radiation are allowed to migrate to the transfer layer 16 by eliminating the electropotential barrier 18. After the electropotential barrier 18 is replaced, these photoexcited electrons are then transferred down the buried channel 49 to the n+-doped region 52 for output. Operating in this manner, the imager 10 can detect and distinguish infrared radiation in two different wavelengths.

It will therefore be seen that the scope of the present invention should not be judged in accordance with this specific example. Other embodiments may include an n-type detection layer and a p-type transfer layer. Additional layers may also be present which do not interfere with the basic functioning of the device as discussed above. The imager described above may be used in conjunction with line imagers (e.g., forward looking infrared imagers) as well as with area imagers (e.g. staring detectors). The imager may also contain a larger or smaller number of electrodes. Other modifications will become apparent to the skilled practitioner upon a study of the specification, drawings and following claims.

What is claimed is:

1. A focal plane imager having an output terminal, said focal plane imager operable to sense and distinguish infrared radiation in a first and a second region of the infrared spectrum, said focal plane imager comprising:
    a substrate layer formed from a material selected from the group of cadmium-zinc-telluride, cadmium telluride, and cadmium selenium;
    a detection layer operable to detect the occurrence of infrared radiation in said first region of the infrared spectrum and generate free charge carriers in response thereto, said detection layer being disposed immediately adjacent to said substrate layer and receiving support therefrom, said detection layer being formed from p-doped mercury-cadmium-telluride;
    a transfer layer operable to selectively generate a first signal in response to the infrared radiation detected by said detection layer and deliver said signal to said output terminal, said transfer layer disposed immediately adjacent to said detection layer and formed from an n-doped layer of mercury-cadmium-telluride, said transfer layer being further operable to selectively generate free charge carriers in response to the receipt of infrared radiation in said second region of the infrared spectrum;
    whereby said focal plane imager is operable to generate a first electrical signal in response to the infrared radiation received by said focal plane imager in said first region of the infrared spectrum and generate a second electrical signal in response to the infrared radiation received by said focal plane imager in said second region of the infrared spectrum.

2. The focal plane imager of claim 1, wherein said transfer layer is operable to detect the occurrence of infrared radiation in a range of wavelengths different from the range of wavelengths detected by said detection layer.

3. The focal plane imager of claim 2, wherein said detection layer and said transfer layer are operable to generate an electropotential barrier.

4. The focal plane imager of claim 3, wherein said electropotential barrier is located substantially within said transfer layer.

5. The focal plane imager of claim 4, wherein said electropotential barrier is formed by the dopant and bandgap variable transition region between said detection layer and said transfer layer.

6. The focal plane imager of claim 5, wherein said transfer layer includes a buried channel through which said transfer layer delivers free charge carriers to said output terminal.

7. The focal plane imager of claim 6, wherein the magnitude of said electropotential barrier may be selectively reduced to allow free charge carriers in said detection layer to migrate to said buried channel.

8. The focal plane imager of claim 7, wherein said imager further includes a charge-coupled device, said charge-coupled device allowing sequential movement of free charge carriers through said buried channel.

9. The focal plane imager of claim 8, wherein said detection layer is composed of mercury-cadmium-telluride having a stoichiometric relationship represented by $Hg_{(1-x)}Cd_xTe$ in which the composition value of x is approximately 0.2.

10. The focal plane imager of claim 9, wherein said transfer layer is composed of mercury-cadmium-telluride having a stoichiometric relationship represented by $Hg_{(1-y)}Cd_yTe$ in which the composition value for y is equal to or greater then 0.3.

11. The focal plane imager of claim 10, wherein said substrate layer, said detection layer and said transfer layer are operable to form an electropotential well within said detection layer to accommodate free charge carriers generated by photoexcitation of said detection layer.

12. The focal plane imager of claim 11, wherein said electropotential well may be selectively eliminated upon the application of an electrical potential to one of the gates forming said charge-coupled device.

* * * * *